(12) United States Patent
Hoshino

(10) Patent No.: US 7,402,756 B2
(45) Date of Patent: Jul. 22, 2008

(54) FLEXIBLE CIRCUIT BOARD

(75) Inventor: Hiroji Hoshino, Tokyo-To (JP)

(73) Assignee: Nippon Mektron, Ltd., Tokyo-To (JP)

( * ) Notice: Subject to any disclaimer, the term of this patent is extended or adjusted under 35 U.S.C. 154(b) by 114 days.

(21) Appl. No.: 11/402,000

(22) Filed: Apr. 12, 2006

(65) Prior Publication Data

US 2006/0226861 A1   Oct. 12, 2006

(30) Foreign Application Priority Data

Apr. 12, 2005   (JP) .............................. 2005-114393

(51) Int. Cl.
*H05K 1/02*   (2006.01)
*H05K 7/06*   (2006.01)

(52) U.S. Cl. ..................... 174/254; 361/749

(58) Field of Classification Search ................. 174/250, 174/254, 117 F, 117 FF; 324/754; 361/748, 361/749, 760; 439/733.1, 43–85; 359/830
See application file for complete search history.

(56) References Cited

U.S. PATENT DOCUMENTS

| | | | | |
|---|---|---|---|---|
| 4,772,936 A | * | 9/1988 | Reding et al. ................ | 257/668 |
| 6,483,713 B2 | * | 11/2002 | Samant et al. ............... | 361/749 |
| 6,525,718 B1 | * | 2/2003 | Murakami et al. ........... | 345/206 |
| 6,542,213 B1 | | 4/2003 | Uchiyama ................... | 349/149 |
| 2003/0094697 A1 | * | 5/2003 | Higashida et al. ........... | 257/758 |
| 2006/0157271 A1 | * | 7/2006 | Miura et al. ................. | 174/250 |

FOREIGN PATENT DOCUMENTS

| | | |
|---|---|---|
| EP | 0693866 A1 | 1/1996 |
| EP | 693866 A1 * | 1/1996 |
| JP | 06-204636 | 7/1994 |
| JP | 8-37351 | 2/1996 |
| JP | 2001-94225 | 4/2001 |
| JP | 2002-094203 | 3/2002 |

\* cited by examiner

*Primary Examiner*—Ricky L Mack
*Assistant Examiner*—Mahidere S Sahle
(74) *Attorney, Agent, or Firm*—Jacobson Holman PLLC

(57) ABSTRACT

A double-sided flexible circuit board with enhanced rigidity of terminals by using copper foil on an opposite side of the circuit board is provided. The flexible circuit board having wiring patterns P for connecting terminals on each of a front surface A and a back surface B of its periphery, includes: terminal patterns with linear-planar-shaped traces, the traces of which are equally spaced and disposed on the peripheries of each of the front surface and the back surface of the board; and backing patterns with planar-shaped traces, the traces of which are combined with the terminal patterns and bent so that the central portion of the backing pattern is offset from that of the terminal pattern, wherein the traces of the backing patterns are disposed on the corresponding opposite side of the traces of the terminal patterns on the board so as to be positioned overlapping with the traces of the terminal patterns.

2 Claims, 5 Drawing Sheets

US 7,402,756 B2

FLEXIBLE CIRCUIT BOARD

BACKGROUND OF THE INVENTION

1. Field of the Invention

The present invention relates to a flexible circuit board and particularly to reinforcing structure of the terminal portion thereof.

2. Related Art

With miniaturization of electronic devices, flexible circuit boards that are suitable for the densification of circuitry have been used for general purpose, and various terminal structures for the densified flexible circuit boards have been proposed (see Japanese Patent Laid-Open No. 1994-204636, Japanese Patent Laid-Open No. 1996-37351, Japanese Patent Laid-Open No. 2001-94225, Japanese Patent Laid-Open No. 2002-94203 etc.).

FIGS. 5A and 5B show a terminal portion of a conventional single-side flexible circuit board. The terminal portion needs a certain degree of rigidity, because connector contacts abut on a contact surface 1 formed at a periphery of the board. On that account, reinforcement material 3 is bonded by means of adhesive 2 on a back surface of the contact surface 1 to provide rigidity to the terminal portion.

On the other hand, the densification of circuitry has shifted the type of flexible circuit boards from single-sided to double-sided, so that circuit boards with both sides thereof connected with a connector have been used. In this case, the circuit boards have contact surfaces on both sides of them.

In such double-sided flexible circuit boards, contact surfaces on both sides are offset each other in the longitudinal direction of traces of wiring pattern and reinforcing plates are bonded on the respective back surfaces in order to enhance the rigidity of the board, while the traces of the wiring pattern on the both sides are offset each other in their width direction in order to use the copper foil for reinforcing the rigidity of the board.

However, if the each trace of the wiring pattern of the both front and back sides is positioned on the back surface of the region between the traces of the respective other side in this manner, there is a problem that sufficient contact pressure can not be obtained when connector contacts are pressed onto the traces, because the space resides on the back surface between the traces of the other side.

The present invention is made in consideration of the above-mentioned problem and it is an object of the present invention to improve rigidity of terminals in a double-sided flexible circuit board by using copper foil on an opposite side of the circuit board.

SUMMARY OF THE INVENTION

To achieve the above-mentioned object, the present invention provides a flexible circuit board having wiring patterns for connecting terminals on each of a front surface and a back surface of its periphery, including:

terminal patterns with linear-planar-shaped traces, the traces of which are equally spaced and disposed on the peripheries of each of the front surface and the back surface of the board; and backing patterns with planar-shaped traces, the traces of which are combined with the traces of the terminal patterns and bent so that the central portion of the trace of the backing pattern is offset from that of the trace of the terminal pattern, wherein the traces of the backing patterns are disposed on the corresponding opposite side of the traces of the terminal patterns on the board so as to be positioned overlapping with the traces of the terminal patterns.

As mentioned above, the present invention can ensure the contact between the traces of the wiring patterns and the connector contacts when they abut each other and realize higher reliability of the connection, because the terminal wiring patterns on respective front and back sides of the double-sided flexible circuit board are disposed in a relationship to back up each other.

DETAILED DESCRIPTION OF THE INVENTION

Embodiments of the present invention are described below referring to FIGS. 1 to 4.

First Embodiment

Figure 1A:
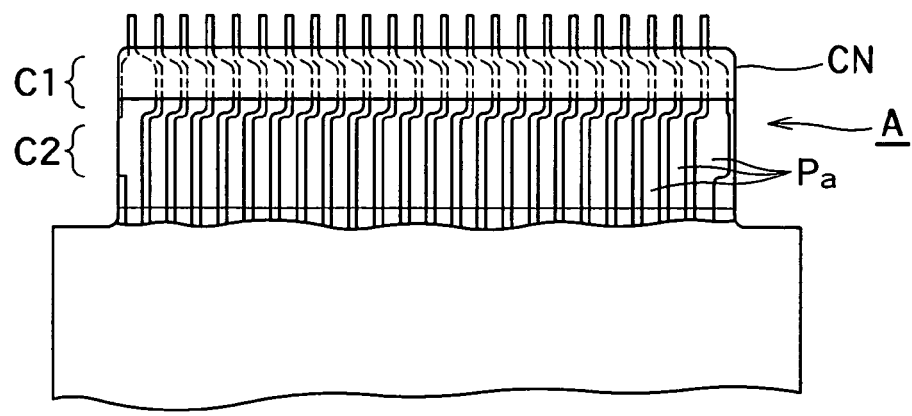
FIGS. 1A, 1B and 1C show views of front surface A, a view of back surface B and a side view of a terminal structure according to an embodiment of the present invention.
Figure 1B:
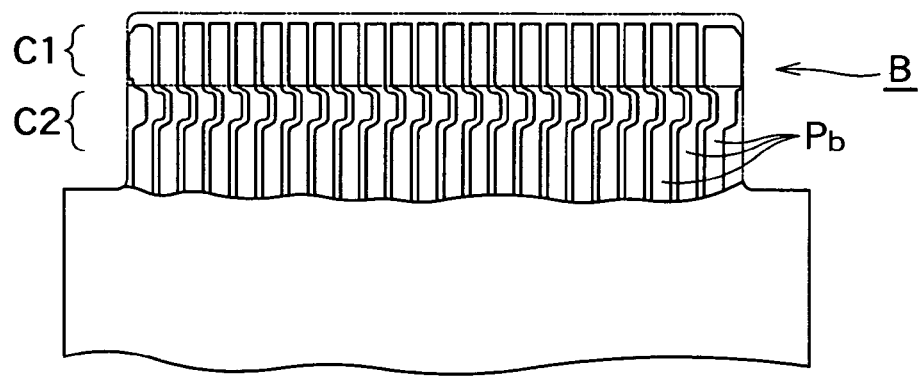
Figure 1C:
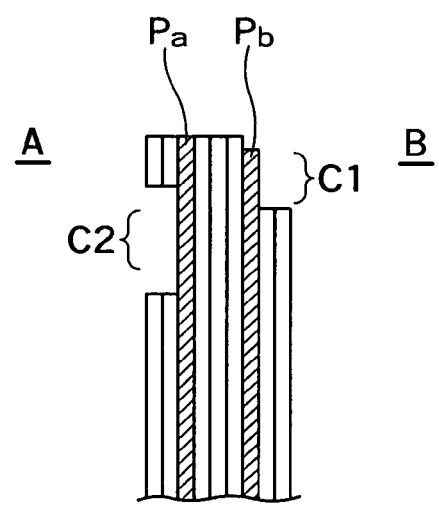

FIGS. 1A, 1B and 1C show views of a front surface A, a view of a back surface B and a side view of a terminal structure according to an embodiment of the present invention. However, FIG. 1A shows the terminal with a connector CN, while FIGS. 1B and 1C show the terminal without a connector.

As shown in FIG. 1A, on the surface A, a contact surface C2 of a terminal pattern, i.e. a wiring pattern Pa, is provided at a location slightly inwardly-spaced from a periphery of a circuit board. The portion shown as symbol C1, which is positioned nearer to the periphery of the board, is a backing portion for a back surface B. In the backing portion, the traces of the wiring pattern Pa are offset by about half a pitch with respect to other portions, resulting in the pattern with substantially horseshoe-shaped bends.

On the other hand, on the back surface B, a contact surface C1 of another terminal pattern, i.e. a wiring pattern Pb, is provided at the periphery of the board, as shown in FIG. 1B, and a backing portion for the contact surface C2 on the front side is formed as a planar pattern with substantially horseshoe-shaped bends.

FIG. 1C shows that the contact surface C2 and the contact surface C1 are provided on the wiring pattern Pa of the surface A and the wiring pattern Pb of back surface B, respectively. Thus, connections are made when connector contacts abut against the contact surfaces C1, C2 provided on each of the front side and the back side of the flexible circuit board.

Figure 2:
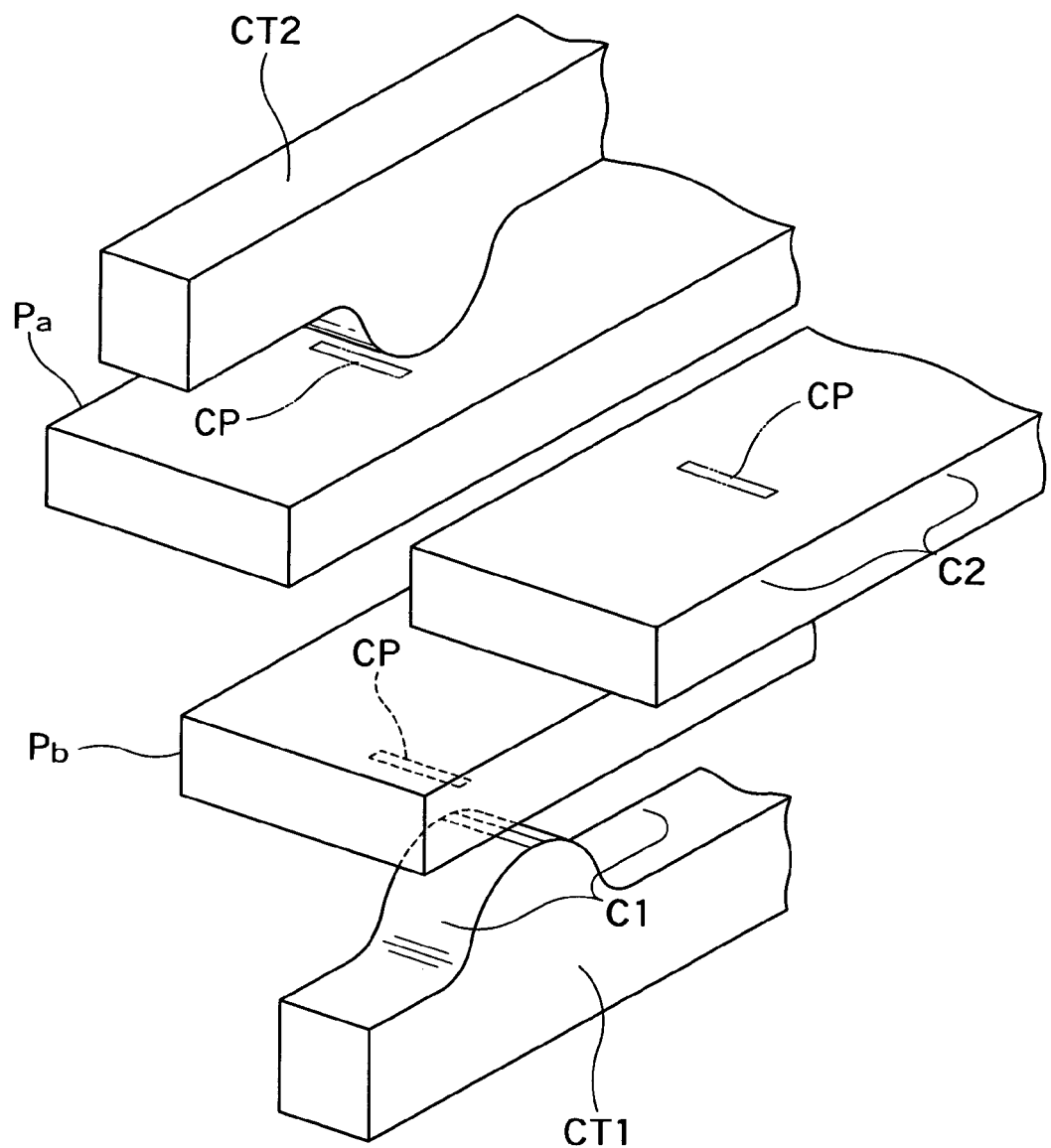
FIG. 2 illustrates an enlarged view depicting abutting portions of terminals formed by traces of wiring patterns on contact surfaces C1, C2 with connector contacts CT.

FIG. 2 shows an enlarged view depicting abutting portions of the terminals formed by the traces of the wiring patterns on the contact surfaces C1, C2 with connector contacts CT. The connector contacts are produced by punching a plate material and they abut against the terminals substantially in line contact state because of their arc-shaped abutting portions formed through the punching process.

As shown with symbol CP, the abutting portions are elongated in the width direction of the terminal and substantially point-like in the longitudinal direction of the same, resulting in a substantial line contact state. Therefore, contacts CT1, CT2 abut against a part of the traces of the wiring patterns across the width direction of the traces, which serve as terminals.

Thus, backing the wiring patterns from the rear side over the range of the width of the contacts CT1, CT2, ensures that they can be connected to the terminals.

Figure 3:
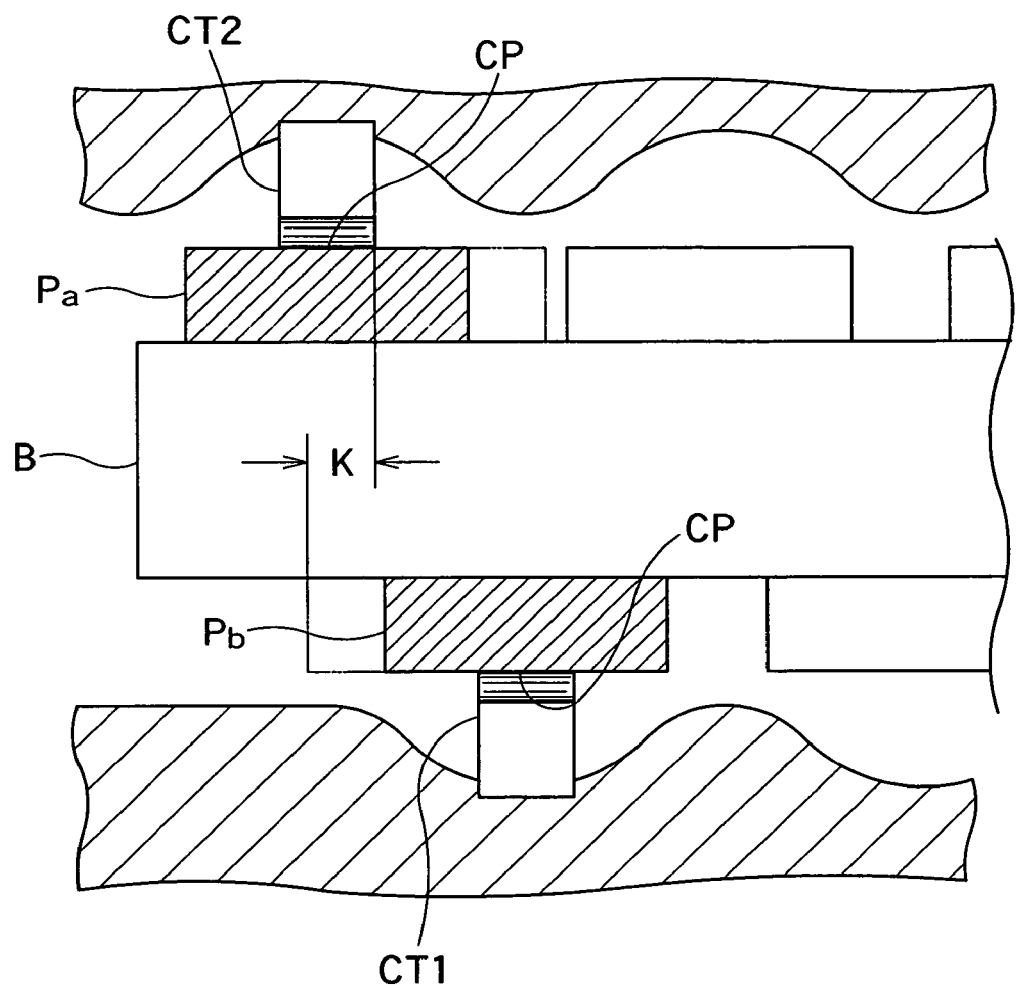
FIG. 3 illustrates a side-view of the contacts CT1, CT2 in FIG. 2 combined with a casing of the connector and a circuit board with wiring patterns.

FIG. 3 shows a side-view of the contacts CT1, CT2 in FIG. 2 combined with a casing of the connector and the circuit board with the wiring patterns.

The contacts CT1, CT2 abut against the center portion of the width of the respective terminals. Thus, if there is a backer on a base material B of the board at the opposite side of the each contact, which is substantially equal to or within the range of the width dimension of the contact, it is then ensured that the contacts CT1, CT2 abut against the traces of the wiring patterns. As the location of the backer is closer to the abutting range of the contacts CT1, CT2, better abutting relationship between the contacts CT1, CT2 and the traces of the wiring patterns is achieved. Preferably, the contacts CT1, CT2 and the corresponding backers widely overlap each other.

As shown in FIG. 3, the phantom lines extending from the traces of the wiring patterns Pa, Pb represent the backing portions as extensions of the wiring patterns Pa, Pb. In the horizontal direction in FIG. 3, the contacts CT1, CT2 and the corresponding backing portions overlap each other, and a larger overlapping region K leads to more secure backing.

Figure 4:
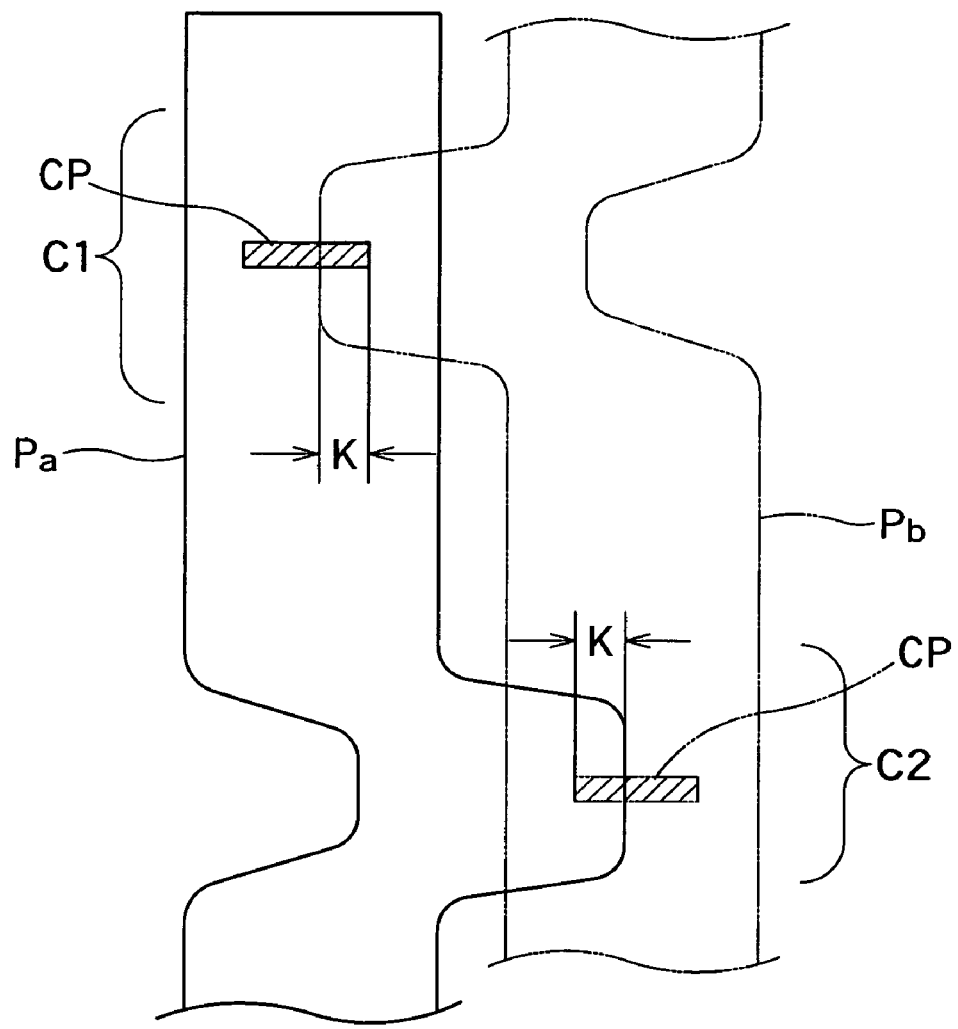
FIG. 4 illustrates a top-view of traces of the wiring patterns Pa, Pb.
Figure 5A:
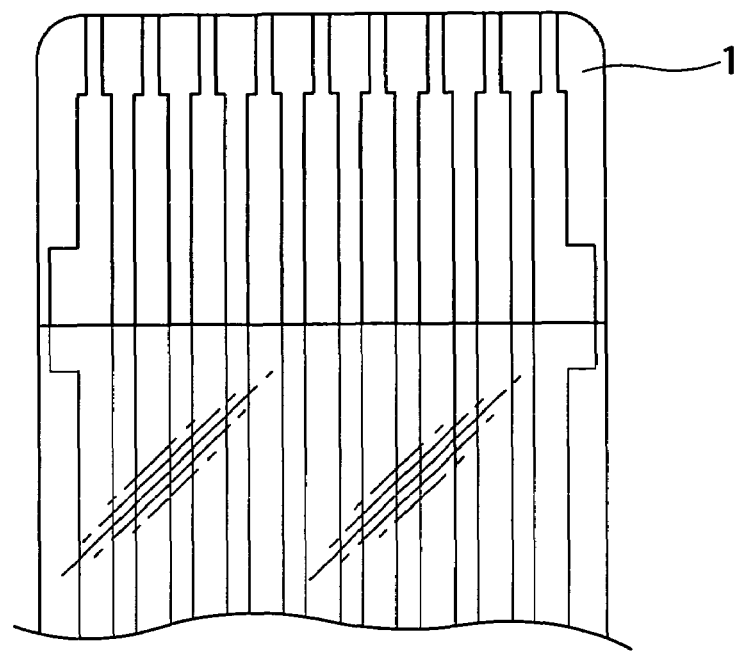
FIGS. 5A and 5B illustrate the terminal portion of the conventional single-side flexible circuit board.
Figure 5B:
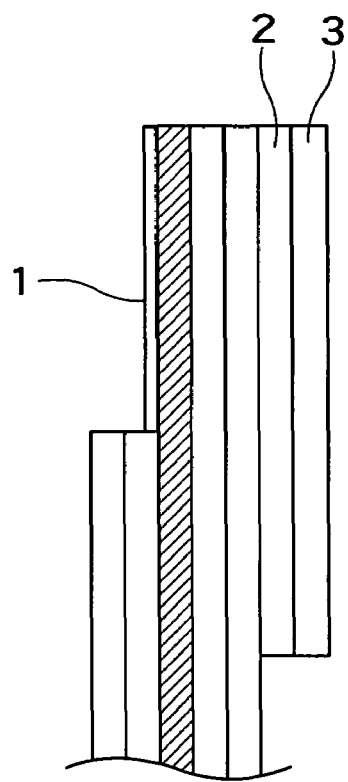

FIG. 4 shows a top-view of traces of the wiring patterns Pa, Pb. A contact point CP resides on the central part in a contact surface C1 of a trace of the wiring pattern Pa, and a trace of the wiring pattern Pb extends from the right side in the drawing to the middle of the contact point CP. In the same manner, for the trace of the wiring pattern Pb, the trace of the wiring pattern Pa extends from the left side in the drawing to the middle of the contact point CP.

As will be appreciated from the foregoing, it is desired that respective traces of the wiring patterns overlap corresponding contact points significantly, but even if the overlapping is not so enough, the abutting relationship between them can be improved as far as the overlapping acts as the backing for the contact point CP.

Another Embodiment

In the foregoing embodiment, the description is made based on the assumption that the contacts abut against the contact surfaces of the traces of the wiring patterns on both sides of the terminal, but if the terminal has a wider area to surface-contact with contacts of a connector, backing can be provided over the wider surface-contact area.

What is claimed is:

1. A flexible circuit board having wiring patterns for connecting terminals on each of a front surface and a back surface of its periphery, the flexible circuit board comprising:
   terminal patterns with linear-planar-shaped traces, the traces being equally spaced and disposed on the peripheries of each of the front surface and the back surface of the board; and
   backing patterns with planar-shaped traces, the traces of the backing patterns being combined with the traces of the terminal patterns and bent so that the central portion of the trace of the backing pattern is offset from that of the trace of the terminal pattern,
   the traces of the backing patterns being disposed on the corresponding opposite side of the traces of the terminal patterns on the board so as to be positioned overlapping with the traces of the terminal patterns, and the traces of the backing patterns being bent to overlap portions on the terminal patterns corresponding to pressing portions of connector contacts.

2. The flexible circuit board according to claim 1, wherein, in the bent portions, the backing patterns include portions with linear planar shape, which reside around the portions corresponding to the pressing portions of the connector contacts.

* * * * *